(12) United States Patent
Shi

(10) Patent No.: US 8,409,473 B2
(45) Date of Patent: Apr. 2, 2013

(54) GROUP II ALLOYED I-III-VI SEMICONDUCTOR NANOCRYSTAL COMPOSITIONS AND METHODS OF MAKING SAME

(75) Inventor: Weili Shi, Troy, NY (US)

(73) Assignee: Evident Technologies, Inc., Troy, NY (US)

( * ) Notice: Subject to any disclaimer, the term of this patent is extended or adjusted under 35 U.S.C. 154(b) by 812 days.

(21) Appl. No.: 11/679,746

(22) Filed: Feb. 27, 2007

(65) Prior Publication Data
US 2008/0202383 A1    Aug. 28, 2008

Related U.S. Application Data

(60) Provisional application No. 60/898,188, filed on Jan. 30, 2007.

(51) Int. Cl.
| C09K 11/70 | (2006.01) |
| C09K 11/72 | (2006.01) |
| C09K 11/77 | (2006.01) |
| C09K 11/54 | (2006.01) |
| C09K 11/56 | (2006.01) |
| C09K 11/08 | (2006.01) |

(52) U.S. Cl. ..... 252/301.6 S; 252/301.4 S; 252/301.6 R

(58) Field of Classification Search ............ 252/301.4 S, 252/301.6 R, 301.6 S
See application file for complete search history.

(56) References Cited

U.S. PATENT DOCUMENTS
2006/0001119 A1 * 1/2006 Liu et al. ................. 257/442

OTHER PUBLICATIONS

Nakamura et al, "Tunable Photoluminescence Wavelength of Chalcopyrite CuInS2-Based Semiconductor Nanocrystals Synthesized in a Colloidal System" plus Supporting Information. Jun. 17, 2006. Chem. Mater. 2006, 18, 3330-3335.*
Streit. Photoluminescence of EuSe and the Magnetic Polaron Model. Phys. Konse. Materie. 11. 231-242.*

* cited by examiner

*Primary Examiner* — Carol M Koslow
*Assistant Examiner* — Matthew E Hoban
(74) *Attorney, Agent, or Firm* — Hoffman Warnick LLC

(57) ABSTRACT

A semiconductor nanocrystal composition that is stable and has high luminescent quantum yield. The semiconductor nanocrystal composition has a semiconductor nanocrystal core of a group II alloyed I-III-VI semiconductor nanocrystal material. A method of making a semiconductor nanocrystal composition is also provides which includes synthesizing a semiconductor nanocrystal core of a group II alloyed I-III-VI semiconductor material.

20 Claims, 7 Drawing Sheets

GROUP II ALLOYED I-III-VI SEMICONDUCTOR NANOCRYSTAL COMPOSITIONS AND METHODS OF MAKING SAME

CROSS-REFERENCE TO RELATED APPLICATIONS

The present application claims priority to U.S. Provisional Patent Application No. 60/898,188 entitled "Group II Alloyed I-III-VI Semiconductor Nanocrystal Compositions and Methods of Making the Same," filed Jan. 30, 2007, which is incorporated by reference herein.

FIELD OF THE INVENTION

The present invention relates to semiconductor nanocrystal compositions and particularly to group II alloyed I-III-VI semiconductor nanocrystal compositions. The present invention also relates to methods of making semiconductor nanocrystal compositions.

BACKGROUND OF THE INVENTION

Semiconductor nanocrystals are typically crystals of II-VI, III-V, IV-VI materials that have a diameter between 1 nanometer (nm) and 20 nm. More recently other semiconductor nanocrystals made from ternary semiconductors such as I-III-VI semiconductors have been disclosed. In the strong confinement limit, the physical diameter of the nanocrystal is smaller than the bulk exciton Bohr radius causing quantum confinement effects to predominate. In this regime, the nanocrystal is a 0-dimensional system that has both quantized density and energy of electronic states where the actual energy and energy differences between electronic states are a function of both the nanocrystal composition and physical size. Larger nanocrystals have more closely spaced energy states and smaller nanocrystals have the reverse. Because interaction of light and matter is determined by the density and energy of electronic states, many of the optical and electric properties of nanocrystals can be tuned or altered simply by changing the nanocrystal geometry (i.e. physical size).

Single nanocrystals or monodisperse populations of nanocrystals exhibit unique optical properties that are size tunable. Both the onset of absorption and the photoluminescent wavelength are a function of nanocrystal size and composition. The nanocrystals will absorb all wavelengths shorter than the absorption onset, however, photoluminescence will always occur at the absorption onset. The bandwidth of the photoluminescent spectra is due to both homogeneous and inhomogeneous broadening mechanisms. Homogeneous mechanisms include temperature dependent Doppler broadening and broadening due to the Heisenburg uncertainty principle, while inhomogeneous broadening is due to the size distribution of the nanocrystals. The narrower the size distribution of the nanocrystals, the narrower the full-width half max (FWHM) of the resultant photoluminescent spectra. In 1991, Brus wrote a paper reviewing the theoretical and experimental research conducted on colloidally grown semiconductor nanocrystals, such as cadmium selenide (CdSe) in particular. Brus L., "Quantum Crystallites and Nonlinear Optics," Applied Physics A, 53 (1991)). That research, precipitated in the early 1980's by the likes of Efros, Ekimov, and Brus himself, greatly accelerated by the end of the 1980's as demonstrated by the increase in the number of papers concerning colloidally grown semiconductor nanocrystals.

Quantum yield (i.e. the percent of absorbed photons that are reemitted as photons) is influenced largely by the surface quality of the nanocrystal. Photoexcited charge carriers will emit light upon direct recombination but will give up the excitation energy as heat if photon or defect mediated recombination paths are prevalent. Because the nanocrystal may have a large surface area to volume ratio, dislocations present on the surface or adsorbed surface molecules having a significant potential difference from the nanocrystal itself will tend to trap excited state carriers and prevent radiative recombination and thus reduce quantum yield. It has been shown that quantum yield can be increased by removing surface defects and separating adsorbed surface molecules from the nanocrystal by adding a shell of a semiconductor with a wider bulk bandgap than that of the core semiconductor.

Inorganic colloids have been studied for over a century ever since Michael Faraday's production of gold sols in 1857. Rossetti and Brus began work on semiconductor colloids in 1982 by preparing and studying the luminescent properties of colloids consisting of II-VI semiconductors, namely cadmium sulfide (CdS). (Rossetti, R.; Brus L., "Electron-Hole Recombination Emission as a Probe of Surface Chemistry in Aqueous CdS Colloids," J. Phys. Chem., 86, 172 (1982)). In that paper, they describe the preparation and resultant optical properties of CdS colloids, where the mean diameter of the suspended particles is greater than 20 nm. Because the sizes of the particles were greater than the exciton Bohr radius, quantum confinement effects that result in the blue shifting of the fluorescence peak was not observed. However, fluorescence at the bulk band edge energies were observed and had a FWHM of 50-60 nm.

CdS colloids exhibiting quantum confinement effects (blue shifted maxima in the absorption spectra) have been prepared since 1984. (Fotjik A., Henglein A., Ber. Bunsenges. Phys. Chem., 88, (1984); Fischer C., Fotjik A., Henglein A., Ber. Bunsenges. Phys. Chem., (1986)). In 1987, Spanhel and Henglein prepared CdS colloids having mean particle diameters between 4 and 6 nm. (Spanhel L., Henglein A., "Photochemistry of Colloidal Semiconductors, Surface Modification and Stability of Strong Luminescing CdS Particles," Am. Chem. Soc., 109 (1987)). The colloids demonstrated quantum confinement effects including the observation of size dependent absorption maxima (first exciton peaks) as well as size dependent fluorescent spectra. The colloids were prepared by bubbling a sulfur containing gas ($H_2S$) through an alkaline solution containing dissolved cadmium ions. The size and resultant color (of the fluorescence) of the resultant nanocrystals were dependent upon the pH of the solution. The colloids were further modified or "activated" by the addition of cadmium hydroxide to the solution that coated the suspended nanocrystals. The resultant core-shell nanocrystals demonstrated that the quantum yield of the photoluminescence increased from under 1% to well over 50% with a FWHM of the photoluminescent spectra under 50 nm for some of the preparations.

Kortan and Brus developed a method for creating CdSe coated zinc sulfide (ZnS) nanocrystals and the opposite, zinc sulfide coated cadmium selenide nanocrystals. (Kortan R., Brus L., "Nucleation and Growth of CdSe on ZnS Quantum Crystallite Seeds, and Vice Versa, in Inverse Micelle Media," J. Am. Chem. Soc., 112 (1990)). The preparation grew ZnS on CdSe "seeds" using an organometallic precursor-based inverse micelle technique and kept them in solution via an organic capping layer (thiol phenol). The CdSe core nanocrystals had diameters between 3.5 and 4 nm and demonstrated quantum confinement effects including observable exciton absorption peaks and blue shifted photoluminescence. Using another preparation, CdSe cores were coated by a 0.4 nm layer of ZnS. The photoluminescence spectra of the resultant core-shell nanocrystals indicates a peak fluorescence at 530 nm with an approximate 40-45 nm FWHM.

Murray and Bawendi developed an organometallic preparation capable of making CdSe, CdS, and CdTe nanocrystals. (Murray C., Norris D., Bawendi M., "Synthesis and Characterization of Nearly Monodisperse CdE (E=S, Se, Te) Semiconductor Nanocrystallites," *J. Am. Chem. Soc.*, 115, (1993)). This work, based on the earlier works of Brus, Henglein, Peyghambarian, allowed for the growth of nanocrystals having a diameter between 1.2 nm and 11.5 nm and with a narrow size distribution (<5%). The synthesis involved a homogeneous nucleation step followed by a growth step. The nucleation step is initiated by the injection of an organometallic cadmium precursor (dimethyl cadmium) with a selenium precursor (TOPSe—trioctylphosphine selenide) into a heated bath containing coordinating ligands (TOPO—trioctylphosphine oxide). The precursors disassociate in the solvent, causing the cadmium and selenium to combine to form a growing nanocrystal. The TOPO coordinates with the nanocrystal to moderate and control the growth. The resultant nanocrystal solution showed an approximate 10% size distribution, however, by titrating the solution with methanol the larger nanocrystals could be selectively precipitated from the solution thereby reducing the overall size distribution. After size selective precipitation, the resultant nanocrystals in solution were nearly monodisperse (capable of reaching a 5% size distribution) but were slightly prolate (i.e. nonspherical having an aspect ratio between 1.1 and 1.3). The photoluminescence spectra show a FWHM of approximately 30-35 nm and a quantum yield of approximately 9.6%.

Katari and Alivisatos slightly modified the Murray preparation to make CdSe nanocrystals. (Katari J., Alivisatos A., "X-ray Photoelectron Spectroscopy of CdSe Nanocrystals with Applications to Studies of the Nanocrystal Surface," *J. Phys. Chem.*, 98 (1994)). They found that by substituting the selenium precursor TOPSe with TBPSe (TriButylPhosphine-Selenide), nanocrystals were produced that were nearly monodisperse without size selective precipitation, crystalline, and spherical. The nanocrystals were size tunable from 1.8 nm to 6.7 nm in diameter and had an exciton peak position ranging from 1.9-2.5 eV (corresponding to 635-496 nm wavelength). Like the Murray paper, TOPO was used as the coordinating ligand.

Hines and Guyot-Sionest developed a method for synthesizing a ZnS shell around a CdSe core nanocrystal. (Hines et al., "Synthesis and Characterization of strongly Luminescent ZnS capped CdSe Nanocrystals," *J. Phys. Chem.*, 100:468-471 (1996)). The CdSe cores, having a monodisperse distribution between 2.7 nm and 3.0 nm (i.e. 5% size distribution with average nanocrystal diameter being 2.85 nm), were produced using the Katari and Alivisatos variation of the Murray synthesis. The photoluminescence spectra of the core show a FWHM of approximately 30 nm with a peak at approximately 540 nm. The core CdSe nanocrystals were separated, purified, and resuspended in a TOPO solvent. The solution was heated and injected with zinc and sulfur precursors (dimethyl zinc and $(TMS)_2S$) to form a ZnS shell around the CdSe cores. The resultant shells were 0.6±3 nm thick, corresponding to 1-3 monolayers. The photoluminescence of the core-shell nanocrystals had a peak at 545 nm, FWHM of 40 nm, and a quantum yield of 50%.

Regulations in Europe and Asia restrict the amount of Cd, Pb, and Hg that can be used in certain commercial products. As a result semiconductor nanocrystals, which do not include these elements are desired for many quantum dot applications such as light emitting diodes, visual displays, solar cells (photovoltaic cells). Many of these applications, in turn, require bright light emission in the visible portion of the spectrum, however the nanocrystals best suited for visible light emission to date have contained cadmium (CdS, CdSe, and CdTe, in particular).

Although much work has been done using visible to near infrared emitting III-V nanocrystal materials, such as InP and InGaP, very little work has been done on I-III-VI semiconductor nanocrystals. Of such work, only weakly fluorescing <5% nanocrystals have been reported. Castro et al, *Chem. Matter* (2003), 15(16), 3142-3147 describes the use of a single source precursor to produce $CuInS_2$ nanocrystals. These nanocrystals aggregated and showed very little fluorescence (Castro et al., "Synthesis and Characterization of Colloidal $CuInS_2$ Nanoparticles from a Molecular Single-Source Precursor," *Phys. Chem. B.*, 108(33), 12429-12435 (2004)). Subsequent publications disclose soluble particles, however, the particles are very weakly fluorescing (<5% quantum yield). Nakamura et al, describes annealing zinc into CuInS to produce weakly fluorescing 5% quantum yield nanocrystals. Without the presence of the Zn a quantum yield of <0.1% was reported. Also reported in the Nakamura paper is the use of a mercaptounadecanoinc acid as a ligand to render them water soluble, however due to the low reported quantum yields the materials produced via these methods are not useful for applications where fluorescence is important.

Accordingly, there is a need in the art to develop a stable I-III-VI semiconductor nanocrystal composition that is brightly fluorescing and soluble in most common solvents.

SUMMARY OF THE INVENTION

In an embodiment, the present invention provides a semiconductor nanocrystal composition comprising a group II element alloyed with a I-III-VI semiconductor nanocrystal core, wherein the semiconductor nanocrystal composition is stable and exhibits a high luminescent quantum yield.

In another embodiment, the present invention provides a method of making a semiconductor nanocrystal composition comprising a group II element and alloyed to I-III-VI semiconductor nanocrystal core, wherein the semiconductor nanocrystal composition is stable and exhibits a high luminescent quantum yield.

DETAILED DESCRIPTION OF THE INVENTION

Figure 1:
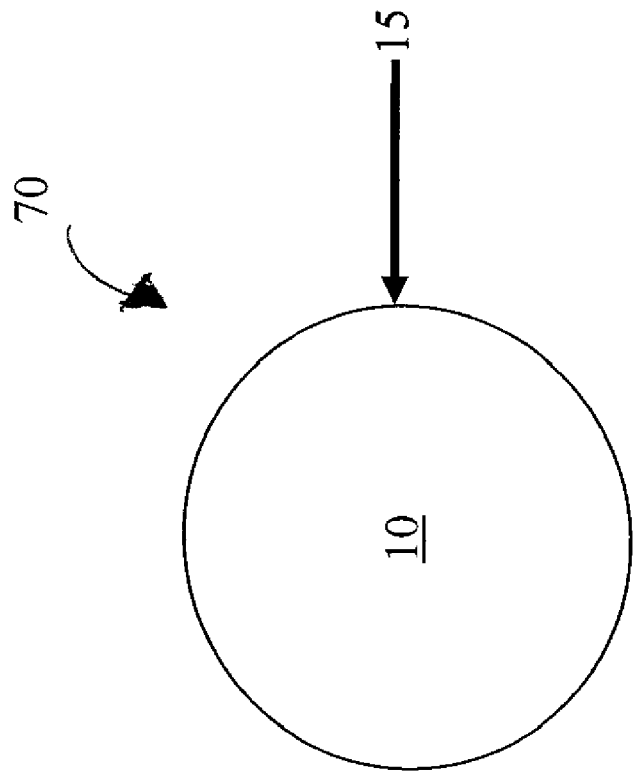
FIG. 1 is a schematic illustration of a nanocrystal composition according to an embodiment of the present invention.

The present invention provides semiconductor nanocrystal compositions comprising a group II alloyed I-III-VI semiconductor material. Referring to FIG. 1, in an embodiment, the present invention provides a semiconductor nanocrystal composition 70 comprising a semiconductor nanocrystal core 10 (also known as a semiconductor nanoparticle or semiconductor quantum dot) having an outer surface 15. Semiconductor nanocrystal core 10 may be spherical nanoscale crystalline materials (although oblate and oblique spheroids can be grown as well as rods and other shapes) having a diameter of less than the Bohr radius for a given material and typically but not exclusively comprises group II alloyed I-III-VI semiconductors. Non-limiting examples of semiconductor materials that semiconductor nanocrystal core 10 can comprise include $ZnCuInGaS_2$, $ZnCuInGaSe_2$, $ZnAgInS_2$, $ZnAgInSe_2$, and $ZnAuGaTe_2$ (I-III-VI materials). In addition to ternary semiconductors, semiconductor nanocrystal core 10 may comprise quaternary or quintary semiconductor materials. Non-limiting examples of quaternary or quintary semiconductor materials include $A_xB_yC_zD_wE_{2v}$ wherein A and/or B may comprise a group I and/or VII element, and C and D may comprise a group III, II and/or V element although C and D cannot both be group V elements, and E may comprise a VI element, and x, y, z, w, and v are molar fractions between 0 and 1.

Figure 2:
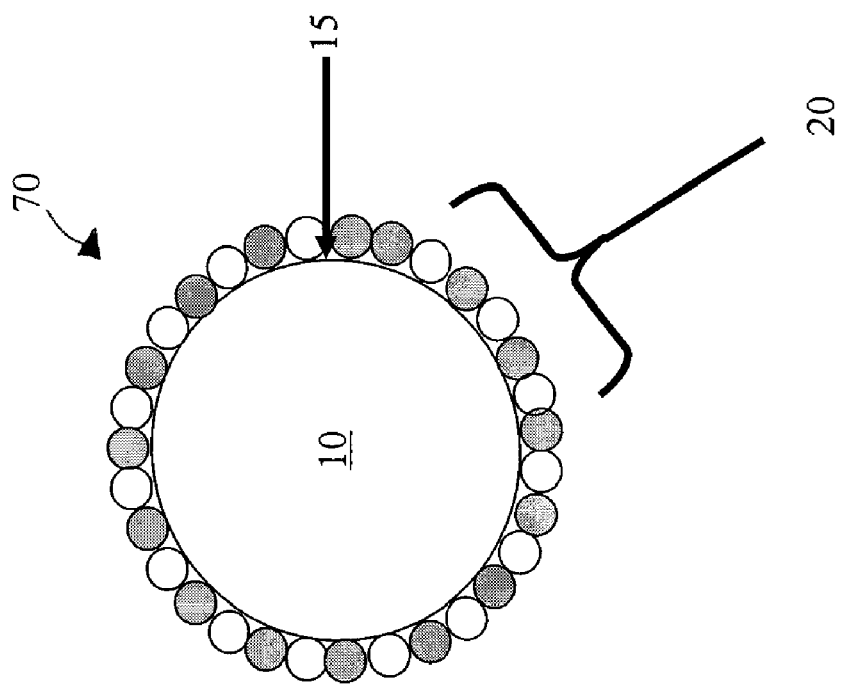
FIG. 2 is a schematic illustration of a nanocrystal composition according to another embodiment of the present invention.

Referring to FIG. 2, in an alternate embodiment, one or more metals 20 are formed on outer surface 15 of semiconductor nanocrystal core 10 (referred to herein as "metal layer" 20) after formation of core 10. Metal layer 20 may act to passivate outer surface 15 of semiconductor nanocrystal core 10 and limit the diffusion rate of oxygen molecules to semiconductor nanocrystal core 10. According to the present invention, metal layer 20 is formed on outer surface 15 after synthesis of semiconductor nanocrystal core 10 (as opposed to being formed on outer surface 15 concurrently during synthesis of semiconductor nanocrystal core 10). Metal layer 20 is typically between 0.1 nm and 5 nm thick. Metal layer 20 may include any number, type, combination, and arrangement of metals. For example, metal layer 20 may be simply a monolayer of metals formed on outer surface 15 or multiple layers of metals formed on outer surface 15. Metal layer 20 may also include different types of metals arranged, for example, in alternating fashion. Further, metal layer 20 may encapsulate semiconductor nanocrystal core 10 as shown in FIG. 2 or may be formed on only parts of outer surface 15 of semiconductor nanocrystal core 10. Metal layer 20 may include the metal from which the semiconductor nanocrystal core is made either alone or in addition to another metal. Non-limiting examples of metals that may be used as part of metal layer 20 include Cd, Zn, Hg, Pb, Al, Ga, or In.

Semiconductor nanocrystal composition 70, according to the present invention, is electronically and chemically stable with a high luminescent quantum yield. Chemical stability refers to the ability of a semiconductor nanocrystal composition to resist fluorescence quenching over time in aqueous and ambient conditions. Preferably, the semiconductor nanocrystal compositions resist fluorescence quenching for at least a week, more preferably for at least a month, even more preferably for at least six months, and most preferably for at least a year. Electronic stability refers to whether the addition of electron or hole withdrawing ligands substantially quenches the fluorescence of the semiconductor nanocrystal composition. Preferably, a semiconductor nanocrystal composition would also be colloidally stable in that when suspended in organic or aqueous media (depending on the ligands) they remain soluble over time. Preferably, a high luminescent quantum yield refers to a quantum yield of at least 10%. Quantum yield may be measured by comparison to Rhodamine 6G dye with a 488 excitation source. Preferably, the quantum yield of the semiconductor nanocrystal composition is at least 25%, more preferably at least 30%, still more preferably at least 45%, and even more preferably at least 55%, and even more preferably at least 60%, including all intermediate values therebetween, as measured under ambient conditions. The semiconductor nanocrystal compositions of the present invention experience little loss of fluorescence over time and can be manipulated to be soluble in organic and inorganic solvents as traditional semiconductor nanocrystals.

Semiconductor nanocrystal core 10 and metal layer 20 may be grown by the pyrolysis of organometallic precursors in a chelating ligand solution or by an exchange reaction using the prerequisite salts in a chelating ligand solution. The chelating ligands are typically lyophilic and have an affinity moiety for the metal layer and another moiety with an affinity toward the solvent, which is usually hydrophobic. Typical examples of chelating ligands include lyophilic surfactant molecules such as Trioctylphosphine oxide (TOPO), Trioctylphosphine (TOP), Tributylphosphine (TBP), Hexadecyl amine (HDA), Dodecanethiol, and Tetradecyl phosphonic acid (TDPA).

Figure 3:
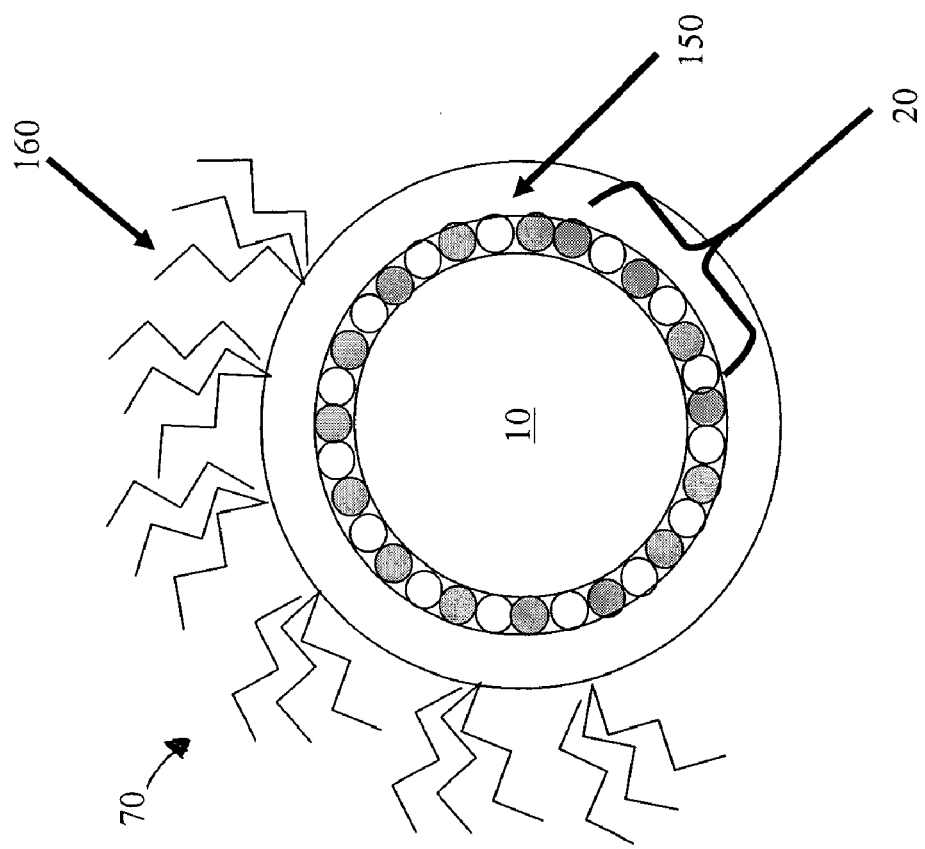
FIG. 3 is a schematic illustration of a nanocrystal composition according to still another embodiment of the present invention.

Referring to FIG. 3, in an alternate embodiment, the present invention provides a nanocrystal composition 70 further comprising a shell 150 overcoating metal layer 20. Shell 150 may comprise a semiconductor material having a bulk bandgap greater than that of semiconductor nanocrystal core 10. In such an embodiment, metal layer 20 may act to passivate outer surface 15 of semiconductor nanocrystal core 10 as well as to prevent or decrease lattice mismatch between semiconductor nanocrystal core 10 and shell 150.

Shell 150 may be grown around metal layer 20 and is typically between 0.1 nm and 10 nm thick. Shell 150 may provide for a type A semiconductor nanocrystal composition 70. Shell 150 may comprise various different semiconductor materials such as, for example, CdSe, CdS, CdTe, ZnS, ZnSe, ZnTe, HgS, HgSe, HgTe, InP, InAs, InSb, InN, GaN, GaP, GaAs, GaSb, PbSe, PbS, PbTe, $CuInGaS_2$, $CuInGaSe_2$, $AgInS_2$, $AgInSe_2$, $AuGaTe_2$, ZnCuInS2.

One example of shell 150 that may be used to passivate outer surface 15 of semiconductor nanocrystal core 10 is ZnS. The presence of metal layer 20 may provide for a more complete and uniform shell 150 without the amount of defects that would be present with a greater lattice mismatch. Such a result may improve the quantum yield of resulting nanocrystal composition 70.

Semiconductor nanocrystal core 10, metal layer 20, and shell 150 may be grown by the pyrolysis of organometallic precursors in a chelating ligand solution or by an exchange reaction using the prerequisite salts in a chelating ligand solution. The chelating ligands are typically lyophilic and have an affinity moiety for the shell and another moiety with an affinity toward the solvent, which is usually hydrophobic. Typical examples of chelating ligands 160 include lyophilic surfactant molecules such as Trioctylphosphine oxide (TOPO), Trioctylphosphine (TOP), Tributylphosphine (TBP), Hexadecyl amine (HDA), Dodecanethiol, and Tetradecyl phosphonic acid (TDPA).

Figure 4:
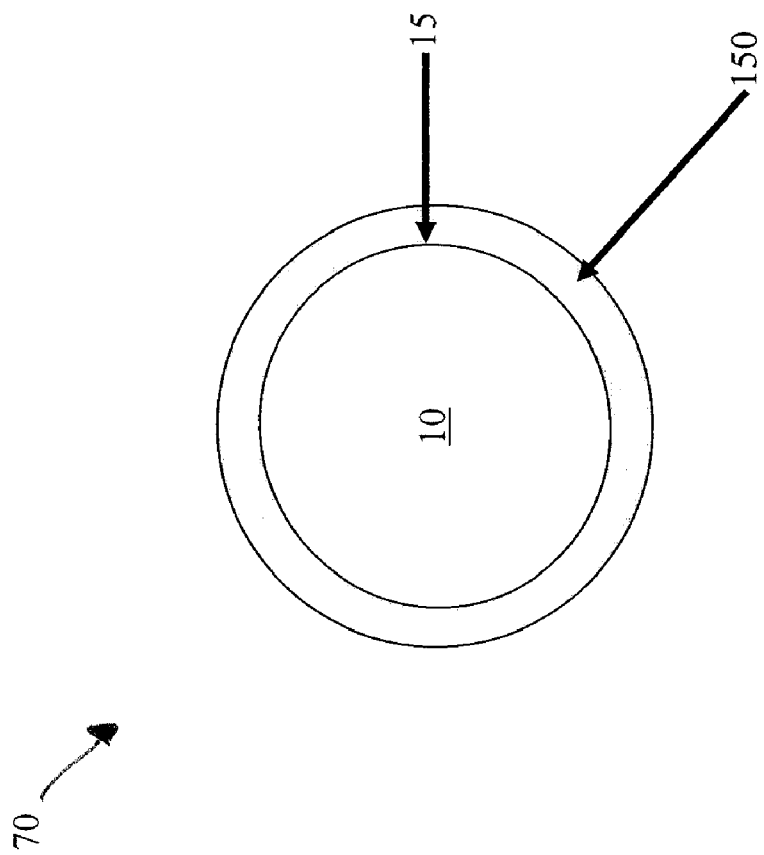
FIG. 4 is a schematic illustration of a nanocrystal composition according to yet another embodiment of the present invention.

Referring to FIG. 4, in an alternate embodiment, the present invention provides a nanocrystal composition 70 comprising a semiconductor nanocrystal core 10 having an outer surface 15, as described above, and a shell 150, as described above, formed on the outer surface 15 of the core 10. The shell 150 may encapsulate semiconductor nanocrystal core 10 as shown in FIG. 4 or may be formed on only parts of outer surface 15 of semiconductor nanocrystal core 10.

In an embodiment, the present invention also provides a substantially monodisperse population of semiconductor nanocrystal compositions, each semiconductor nanocrystal composition comprising a semiconductor nanocrystal core comprising a group II alloyed I-III-VI semiconductor material, wherein the semiconductor nanocrystal composition is stable with a high luminescent quantum yield.

The population of semiconductor nanocrystal compositions may be substantially homogenous with respect to the phase of the nanocrystals. The phase of a population of nanocrystal can be determined through the use of Powder X-Ray diffraction.

The semiconductor nanocrystal compositions of the present invention may be grown such that photoexcited electrons and holes within the particles are quantum confined. It is preferable that the nanocrystal core diameters are less than 20 nm in diameter. More preferably, the semiconductor nanocrystals may be grown such that the diameters are less than 15 nm. Most preferably, the diameter of the core semiconductor nanocrystals may be less than 10 nm.

The ability to control the size and elemental composition of the particles in the present invention allows for the semiconductor nanocrystal compositions to emit light in the visible portion of the spectrum between 400 nm and 600 nm and more preferably between 500 nm and 600 nm. To date, these wavelengths have proven to be difficult to achieve with semiconductor nanocrystal compositions that do not contain cadmium.

Figure 5:
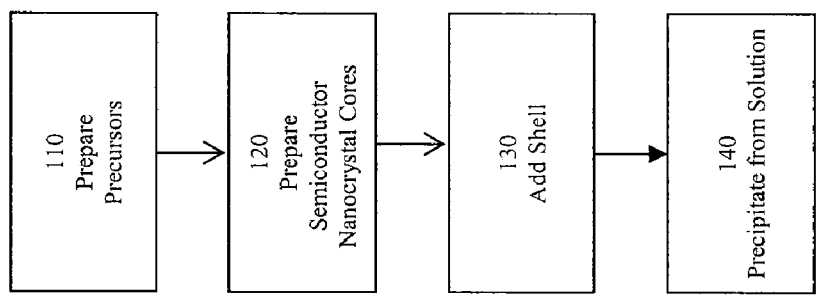
FIG. 5 is a flow chart illustrating a method of making a nanocrystal composition according to an embodiment of the present invention.

FIG. 5 provides an exemplary method of making a nanocrystal composition of the present invention. Although the exemplary method will be described with respect to the preparation of a $ZnCuInGaS_2$ semiconductor nanocrystal core with an optional ZnS shell, it will be appreciated that other types and combinations of semiconductor cores, metal layers and/or semiconductor shells may be used to manufacture a nanocrystal composition of the present invention. Further, additional layers can be added to the semiconductor nanocrystal composition.

In step 110, the required zinc, copper, indium, gallium, and sulfur precursors are prepared. A precursor is often needed for the Group I material, for example Cu, Ag, or Au. These materials may be purchased from various chemical supply companies. Non-limiting examples of compositions that may be used as a precursor for the preparation of a Group I material in the semiconductor nanocrystal compositions of the present invention include Cu(I)thiolate, Cu(I)acetate, Cu(II) acetate, Ag carbamates, Au thiols, Au acetates, and any combination thereof. It has been found that copper thiolate works particularly well as a precursor for the manufacture of a I-III-VI semiconductor nanocrystal core comprising copper. In the event Cu(I) acetate is used as a copper precursor, the copper acetate may first be heated with a dodecanethiol to form a copper thiolate composition prior to the preparation of the group II alloyed I-III-VI semiconductor nanocrystal core. The copper thiolate precursor may be generated from a combination of copper acetate and dodecanethiol at temperatures of approximately 100° C. In addition to the copper ions used in the reaction, several Zn salts have showed to be effective for the Zn alloying. It has been found that Zn(Oleate) works particularly well. Indium and gallium precursors are made by mixing indium acetate and gallium acetylacetonate and palmitic acid where the molar ratio between indium and gallium is, for example, 1:1 to 20:1, and preferably 9:1, while the ratio of palmitic acid to the sum of gallium and indium is approximately 3:1. The solution is then heated to approximately 130° C. to form indium gallium palmitic precursor. Gallium acetate and indium acetylacetonate may also be used. The sulfur precursor can be derived from elemental sulfur dissolved in oleylamine at room temperature and pressure.

In step 120, the semiconductor nanocrystal cores are prepared. A specific procedure for growing a core semiconductor nanocrystal comprising a group II alloyed I-III-VI semiconductor material is described in the example 1 below. Although, the procedure is described with respect to the preparation of a $ZnCuInGaS_2$ a (a quintary semiconductor), a quaternary semiconductor material may be grown using a single group III element instead of two group III elements (i.e. $ZnCuInS_2$ or $ZnCuGaS_2$). Preparing a semiconductor nanocrystal core may involve $CuInGaS_2$ in a coordinating solvent. In certain embodiments, all Zn, Ga, In, and Cu precursors are mixed in a non-coordinating solvent (for example, 'ODE', 1-octadecene) at room temperature and approximately room pressure and the solution is heated between approximately 150° C. and 280 C, preferably 180° C. Once the solution has reached a particular reaction temperature (such as 180° C., for example), the sulfur oleylamine precursor can be quickly injected into the reaction vessel and the nanocrystals begin to form (preferably the reaction mixture is held at 180° C. throughout the reaction period). The reaction period determines the size of the resulting nanocrystals such that the longer the reaction period the larger the ensuing nanocrystals. Once the nanocrystal cores have reached the desired size, the reaction can be stopped by quickly cooling to temperatures below 70° C., for example, by adding a cold solvent into the reaction vessel, immersing the reaction vessel in a cold bath, or blowing cool gas onto the reaction vessel. In certain embodiments, once the nanocrystal cores are synthesized, the surface of the core nanocrystal is made "metal rich" (for example, a monolayer of zinc is added to the nanocrystal core). This metal "layer" improves the quality of the subsequent semiconductor shelling step resulting in brighter and more stable quantum dots. One non-limiting process for metal coating the semiconductor nanocrystal core or rather creating a metal rich surface is as follows: zinc oleate is once again added to the reaction mixture (which now contain the nanocrystal cores); the reaction mixture is then heated to 180 C for greater than 20 minutes at room pressure. After the "metal layer" is added, the reaction mixture is cooled to room temperature.

In order to isolate the semiconductor nanocrystals cores from a non-coordinating solvent, pure acetone or a mixture of methanol and toluene may be added to the solution at temperatures ranging from room temperature to 100° C. until the mixture becomes visibly turbid. Because the semiconductor nanocrystal cores have a hydrophobic oleylamine/dodecanethiol surfactant layer on the surface, they are insoluble in acetone or methanol which facilitates the nanocrystal separation from the reaction mixture. The "metal coated" nanocrystal cores are then separated from the reaction mixture by sedimentation/flocculation (via centrifuge). Washing the semiconductor nanocrystal cores in methanol and toluene results in semiconductor nanocrystals cores precipitating out of solution.

In step 130, a shell may be added to the semiconductor nanocrystal core. To form the shell, two precursor solutions can be added to the solution of the semiconductor nanocrystal core. Preferably, the precursors can be added at a temperature range between about 130° C. and 250° C., and more preferably 180° C. The first solution can be a metal precursor in a ligand, the second solution can be $(TMS)_2S$ in TOP. Enough of the solutions are added to allow ZnS to shell the surface of the semiconductor nanocrystal core.

An alternative method of adding a shell to the surface of a nanocrystal core is through successive addition of metal monolayers, followed by the addition of a chalcagonide, pnictide or a non-metal anion monolayers, followed by the addition of a second metal monolayer layer (these steps may be repeated to build up a thicker shell). This method of treating a semiconductor nanocrystal surface with successive metal-anion-metal coating steps has been found to increase the quantum yield of the resulting composition and maintain spectral and quantum yield stability when the nanocrystal compositions are added to a variety of solvents, including water and other organic and inorganic solvents with little or no loss of fluorescence, using standard nanocrystal chemistry.

The procedure for adding the non-metal anion layer and the second metal layer is as follows. One or more anions may be attached to the semiconductor nanocrystal core containing the newly added metal layer. Preferably, the temperature at which the anions may be attached is between about room temperature and 120° C. The anion layer may be a layer of one or more anionic elements and does not include metallic compounds. The anion layer may include any number, type, combination, and arrangement of anions. For example, the anion layer may be simply a monolayer of anions added to the metal layer. Non-limiting examples of elements that may comprise the anion layer include group IV, V, and VI elements.

Once the nanocrystal synthesis is complete, the desired nanocrystal compositions precipitate out of solution in step 140. Preferably, the compositions are precipitated out of solution at a temperature between about room temperature and 120° C.

All the above described steps may take place under nitrogen to improve the quantum yield of the resulting nanocrystal composition. The resulting nanocrystal compositions are more resistant to oxidation and have an increased quantum yield over semiconductor nanocrystals of group II alloyed I-III-VI made by known techniques. The nanocrystals resulting from step 130 may be size separated. Size separating the nanocrystal yields solutions with crystals that are more monodisperse and retain the quantum yield.

The above-described technique is only exemplary and other modifications may be made that result in semiconductor nanocrystal compositions according to the present invention.

EXAMPLE

Preparing a Group II Alloyed I-III-VI Semiconductor Nanocrystal Composition

The present example discloses how to prepare a stable, high luminescent quantum yield semiconductor nanocrystal composition comprising a core of $ZnCuInGaS_2$, a Zn metal layer formed on the outer surface of the semiconductor nanocrystal core after synthesis of the core, and a ZnS shell formed on the Zn metal layer. However, the teachings of the below procedure may be used to produce other group II alloyed I-III-VI nanocrystal compositions discussed above.

The first step is preparing an indium and gallium precursor. In a reaction flask, 292 g/mol of 0.9 Molar indium (III) acetate (99.99% pure) is added to 367 g/mol of 0.1 Molar gallium acetylacetonate (99% pure) and 256.4 g/mol of 3 Molar palmitic acid (99% pure). The ingredients are mixed and heated to 130° C. for 2 hours under vacuum. The vacuum removes any acetic acid that could form. The resulting precursor solution should be clear but may have a yellow tint.

Next, the $ZnCuInGaS_2$ semiconductor nanocrystal core is prepared. To a three neck reaction flask, the following materials are added. 10 mg of Cu(I)thiolate are added as a copper precursor. As an alternative, other copper precursors may be used including Cu(I)acetate, in which case, the copper acetate would first be heated with a dodecanethiol to form a composition prior to mixing with the other precursor material. 5 ml of 1-octadecene (ODE) are added as a high boiling solvent to allow the reaction to take place. Other non-coordinating high boiling solvents may be used as alternatives. 1 ml of dodecanethiol is added. Other thiols or di-thiols that bond strongly to the copper ion may be used as alternatives. 1 ml of oleylamine is added to act as a coordinating solvent and to activate the indium and gallium precursor. 1 g of the indium and gallium precursor, as prepared above at the concentrations described, is added. 1 ml of 1 Molar S-oleylamine solution is added as a sulfur precursor. 0.315 g (0.5 mmol) of zinc oleate is added as a zinc precursor. Vacuum is then applied to the three neck flask for 2 minutes, followed by increasing the reaction temperature to 180° C. When the solution reaches 180° C., the sulfur precursor (1 ml of 1 Molar S-oleylamine solution) is rapidly injected. After 10 minutes, the reaction is stopped by quenching with cold gas (nitrogen, argon, or air).

Then, the Zn metal layer is formed. Following the initial core synthesis, a zinc metal layer is applied to the outer surface of the nanocrystal core by adding 0.63 g of zinc oleate to the reaction mixture at room temperature. Vacuum is applied and the reaction is once again heated to 180° C. for 30 minutes.

The resulting metal coated nanocrystals cores are then separated from the residual precursors and solvents in the following manner. The solution is added to a centrifuge tube and methanol and acetone are added. The centrifuge is run at 4,000 xg and the supernatant decanted. The resulting retentate is solvated into chloroform.

The ZnS shell is then formed. About half of the now-solvated $ZnCuInGaS_2$ nanocrystal core products is dissolved in 4 ml toluene and transferred into a microwave tube. The tube is purged using nitrogen for 10 minutes. 0.08 g (0.125 mmol) of zinc oleate in 1 g of TOP as a zinc precursor and 25 μl (0.1185 mmol) of hexamethyldisilathiane ($(TMS)_2S$) in 1 g of TOP as a sulfur precursor are alternately added to the reaction mixture drop by drop at room temperature. The reaction mixture is then cooked using a microwave for 8 minutes at 300 W and about 230° C.

After the reaction mixture cools down, $ZnCuInGaS_2$—ZnS core shell nanoparticles are precipitated from the toluene by adding acetone, followed by centrifugation. The nanoparticles are then redispersed in $CHCl_3$, toluene, hexane, or other non-polar solvents.

Figure 6:
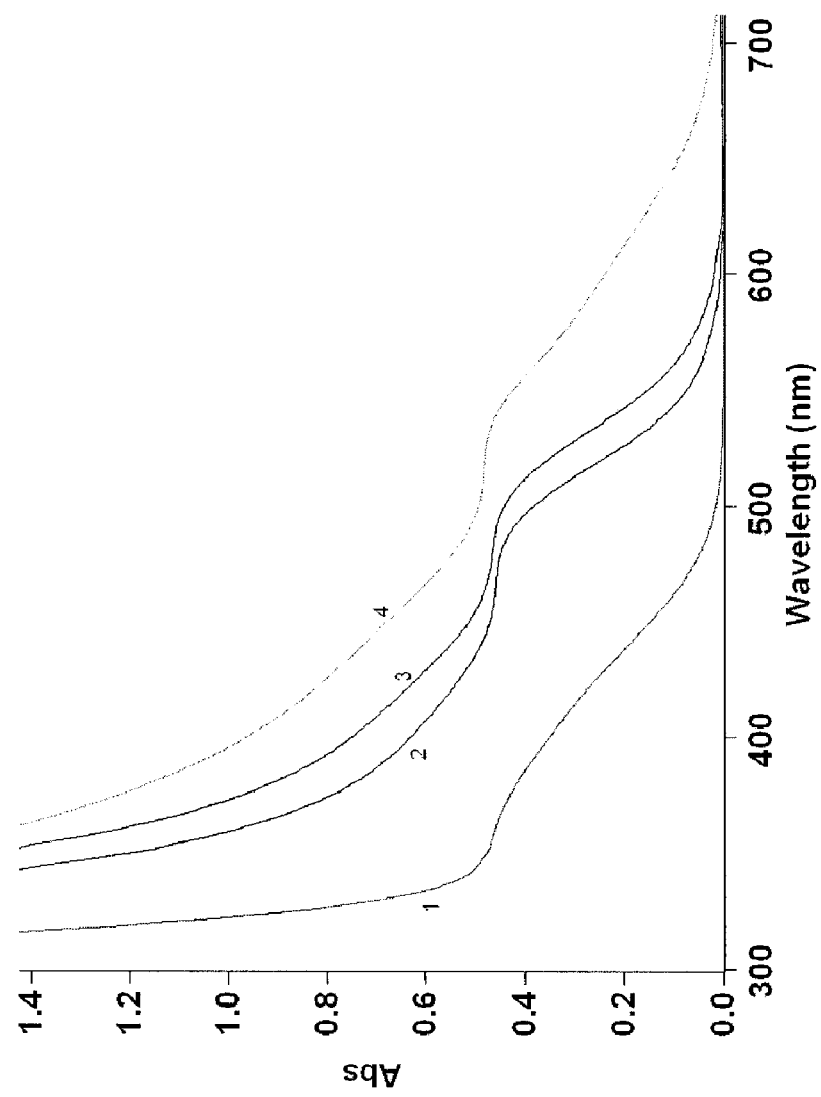
FIG. 6 is a graph depicting absorption spectra of nanocrystal compositions according to an embodiment of the present invention.
Figure 7:
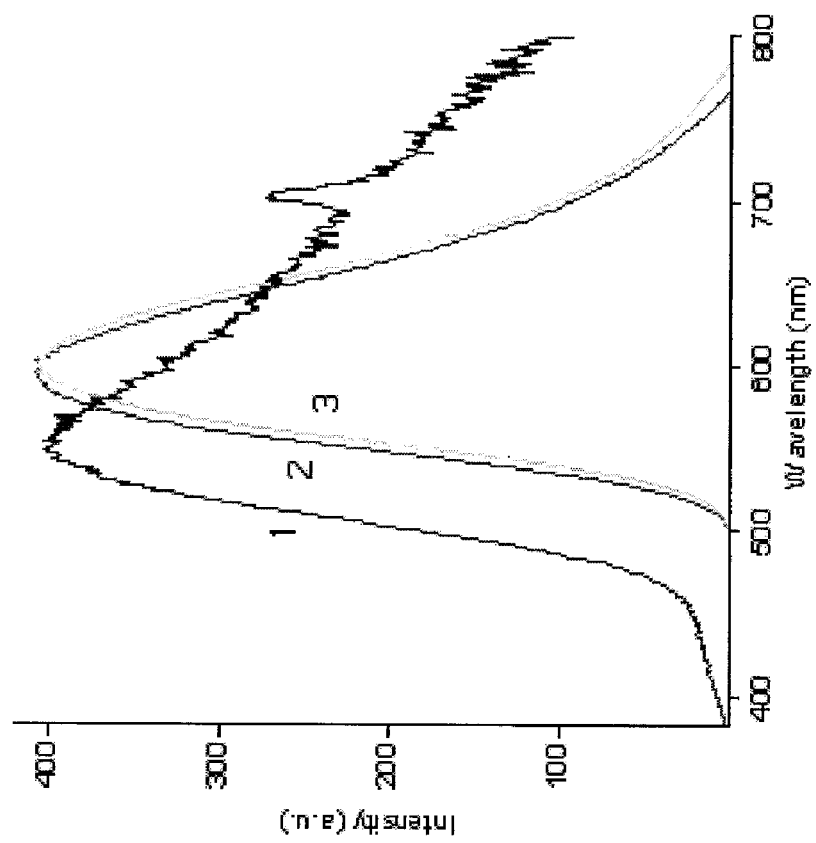
FIG. 7 is a graph depicting photoluminescence spectra of nanocrystal compositions according to an embodiment of the present invention.

FIGS. 6 and 7 demonstrate the positive effects of alloying Zn into a $CuInGaS_2$ core, as in the above Example, to provide a group II alloyed I-III-VI semiconductor nanocrystal core according to an embodiment of the present invention. Referring to FIG. 6, an absorption graph is shown. Curve 4 depicts the absorption spectrum of a $CuInGaS_2$ core without Zn, in which the first exciton peak occurs at ~520 nm. Curves 1-3 depict the absorption spectra of $ZnCuInGaS_2$ cores, as in embodiments of the present invention. Curve 1 depicts the absorption spectrum of a $ZnCuInGaS_2$ core with a higher Zn concentration, i.e., a Zn to Cu ratio of 7.5:1, in which the first exciton peak occurs at ~380 nm. Curve 2 depicts the absorption spectrum of a $ZnCuInGaS_2$ core with a lower Zn concentration than the core of Curve 1, i.e., a Zn to Cu ratio of 1:1, in which the first exciton peak occurs at ~490 nm. Curve 3 depicts the absorption spectrum of a $ZnCuInGaS_2$ core with the same lower Zn concentration as the core of Curve 2, but with larger nanocrystal diameters, in which the first exciton peak occurs at ~510 nm.

Referring to FIG. 7, a photoluminescence graph is shown. The photoluminescence spectrum of the above-mentioned CuInGaS$_2$ core without Zn (not shown) has a photoluminescence peak at ~620 nm. In FIG. 7, Curve 1 depicts the photoluminescence spectrum of the above-mentioned ZnCuInGaS$_2$ core with a higher Zn concentration, in which the photoluminescence peak occurs at 548 nm. Curve 2 depicts the photoluminescence spectrum of the above-mentioned ZnCuInGaS$_2$ core with a lower Zn concentration than the core of Curve 1, in which the photoluminescence peak occurs at ~590 nm. Curve 3 depicts the absorption spectrum of the above-mentioned ZnCuInGaS$_2$ core with the same lower Zn concentration as the core of Curve 2, but with larger nanocrystal diameters, in which the photoluminescence peak occurs at ~608 nm.

From FIGS. 6 and 7, it is clear that, by alloying Zn into a CuInGaS$_2$ core, the resulting ZnCuInGaS$_2$ core is improved over known cores. For example, alloying Zn into a CuInGaS$_2$ core to provide the ZnCuInGaS$_2$ cores blue shifts the photoluminescence peak and the first exciton peak to preferable wavelengths.

Also, the adjustments of the diameter sizes (e.g., the cores of Curves 2 and 3) may be used to reach preferable wavelengths, where the larger diameters demonstrate a photoluminescence peak and a first exciton peak at longer wavelengths than the smaller diameters. The different diameters may be created by core synthesizing for different amounts of time.

Forming a ZnS shell on a Zn clad ZnCuInGaS$_2$ core serves to increase the quantum yield (brightness) exhibited by the nanocrystals.

It should be noted that adding a ZnS shell to the ZnCuInGaS$_2$ nanocrystal cores results in a further 10-20 nm blue shift of the photoluminescence peak and the first exciton peak. Addition of the ZnS shell at the appropriate temperatures and elemental concentrations described in the Example also results in quantum yields in excess of 50%.

The foregoing description and example have been set forth merely to illustrate the invention and are not intended as being limiting. Each of the disclosed aspects and embodiments of the present invention may be considered individually or in combination with other aspects, embodiments, and variations of the invention. In addition, unless otherwise specified, none of the steps of the methods of the present invention are confined to any particular order of performance. Modifications of the disclosed embodiments incorporating the spirit and substance of the invention may occur to persons skilled in the art and such modifications are within the scope of the present invention. Furthermore, all references cited herein are incorporated by reference in their entirety.

What is claimed is:

1. A semiconductor nanocrystal composition comprising:
a semiconductor nanocrystal core comprising a group II alloyed I-III-VI semiconductor material, wherein the semiconductor nanocrystal composition is electronically and chemically stable with a luminescent quantum yield of at least 25%.

2. The semiconductor nanocrystal composition of claim 1, wherein the semiconductor nanocrystal core has an outer surface and the semiconductor nanocrystal composition further comprises:
a metal layer formed on at least a portion of the outer surface of the semiconductor nanocrystal core.

3. The semiconductor nanocrystal composition of claim 1, wherein the semiconductor nanocrystal core has an outer surface and the semiconductor nanocrystal composition comprises:
a shell comprising a semiconductor material formed on the outer surface of the semiconductor nanocrystal core.

4. The semiconductor nanocrystal composition of claim 1, wherein the semiconductor nanocrystal core has an outer surface and the semiconductor nanocrystal composition comprises:
a metal layer formed on the outer surface of the semiconductor nanocrystal core; and
a shell comprising a semiconductor material overcoating the metal layer.

5. The semiconductor nanocrystal composition of claim 1, wherein the semiconductor nanocrystal core has an outer surface and the semiconductor nanocrystal composition comprises:
a metal layer formed on the outer surface of the semiconductor nanocrystal core; and
an outer coating comprising an anion layer overcoating the metal layer and a second metal layer overcoating the anion layer.

6. The semiconductor nanocrystal composition of claim 1, wherein the semiconductor nanocrystal core comprises a quaternary or a quintary semiconductor material.

7. The semiconductor nanocrystal composition of claim 1, wherein the semiconductor nanocrystal core comprises ZnCuInGaS$_2$.

8. The semiconductor nanocrystal composition of claim 2, wherein the metal layer comprises Zn.

9. The semiconductor nanocrystal composition of claim 3, wherein the shell comprises Zn and S.

10. The semiconductor nanocrystal composition of claim 1, wherein the luminescent quantum yield is at least 30%.

11. The semiconductor nanocrystal composition of claim 1, wherein the luminescent quantum yield is at least 45%.

12. The semiconductor nanocrystal composition of claim 1, wherein the luminescent quantum yield is at least 60%.

13. A semiconductor nanocrystal composition of claim 1 that emits light with a peak emission wavelength from 400 nm to 600 nm.

14. A substantially monodisperse population of semiconductor nanocrystal compositions, each semiconductor nanocrystal composition comprising:
a semiconductor nanocrystal core, the semiconductor nanocrystal core comprising a group II alloyed I-III-VI semiconductor material , wherein the semiconductor nanocrystal composition is stable with a luminescent quantum yield of at least 25%.

15. A method of making a semiconductor nanocrystal composition comprising:
synthesizing a semiconductor nanocrystal core comprising a group II alloyed I-III-VI semiconductor material, wherein the semiconductor nanocrystal core has an outer surface, and wherein the semiconductor nanocrystal composition has a luminescent quantum yield of at least 25%.

16. The method of claim 15, further comprising:
forming a metal layer on at least a portion of the outer surface of the semiconductor nanocrystal core after synthesis of the semiconductor nanocrystal core.

17. The method of claim 15, further comprising:
forming a shell on the outer surface of the semiconductor nanocrystal core after synthesis of the semiconductor nanocrystal core.

18. The method of claim 15, further comprising:
forming a metal layer on the outer surface of the semiconductor nanocrystal core after synthesis of the semiconductor nanocrystal core; and overcoating the metal layer with a shell comprising semiconductor material.

19. The method of claim 15, further comprising:

forming a metal layer on the outer surface of the semiconductor nanocrystal core after synthesis of the semiconductor nanocrystal core; and overcoating the metal layer with an outer coating comprising an anion layer and a second metal layer.

20. The method of claim 15, wherein the Group II element and the Group VI element in the semiconductor material are derived from different precursors.

* * * * *